United States Patent [19]
Dobson et al.

[11] Patent Number: 5,858,880
[45] Date of Patent: Jan. 12, 1999

[54] METHOD OF TREATING A SEMI-CONDUCTOR WAFER

[75] Inventors: Christopher David Dobson, Bristol; Adrian Kiermasz, Weston-super-Mare, both of United Kingdom

[73] Assignee: Trikon Equipment Limited, Bristol, United Kingdom

[21] Appl. No.: 578,660

[22] PCT Filed: May 10, 1995

[86] PCT No.: PCT/GB95/01057

§ 371 Date: Jan. 5, 1996

§ 102(e) Date: Jan. 5, 1996

[87] PCT Pub. No.: WO95/31823

PCT Pub. Date: Nov. 23, 1995

Related U.S. Application Data

[63] Continuation-in-part of Ser. No. 362,429, Dec. 28, 1994.

[30] Foreign Application Priority Data

May 14, 1994 [GB] United Kingdom .................... 9409713

[51] Int. Cl.$^6$ ....................................................... B05D 3/06
[52] U.S. Cl. ......................... 438/758; 438/758; 438/759; 438/624; 438/787; 438/902
[58] Field of Search ................................... 437/225, 235, 437/238; 438/758, 759, 624, 787, 902

[56] References Cited

U.S. PATENT DOCUMENTS

| | | |
|---|---|---|
| 3,822,328 | 7/1974 | Smolinsky et al. . |
| 4,096,315 | 6/1978 | Kubacki . |
| 4,397,722 | 8/1983 | Haller . |
| 4,494,303 | 1/1985 | Celler et al. ........................ 29/576 W |
| 4,759,993 | 7/1988 | Pai et al. ................................. 428/450 |
| 4,781,942 | 11/1988 | Leyden et al. . |
| 5,314,724 | 5/1994 | Tsukume et al. . |
| 5,360,646 | 11/1994 | Morita ..................................... 427/574 |
| 5,506,008 | 4/1996 | Klumpp et al. . |
| 5,618,745 | 4/1997 | Kita ........................................ 438/164 |
| 5,627,391 | 5/1997 | Shimada et al. ......................... 257/310 |

FOREIGN PATENT DOCUMENTS

| | | |
|---|---|---|
| 0 353 818 A | 2/1990 | European Pat. Off. . |
| 0 382 932 A2 | 8/1990 | European Pat. Off. . |
| 0 568 235 A1 | 11/1993 | European Pat. Off. . |
| 0 743 675 A1 | 11/1996 | France . |
| 2 125 423 | 8/1982 | United Kingdom . |
| WO 91/12630 | 8/1991 | WIPO . |
| WO 94/01885 | 1/1994 | WIPO ..................................... 21/316 |

OTHER PUBLICATIONS

U.S. application No. 08/362,429, Dobson, filed Dec. 28, 1994.

Ito et al., "Reduction of Water in Inorganic SOG by Plasma Treatment", *Extended Abstracts of the 22nd Int. Conf. on Solid State Devices and Materials*, 1990, pp. 235–238.

Primary Examiner—Charles Bowers
Assistant Examiner—Thanh Nguyen
Attorney, Agent, or Firm—Jones & Volentine L.L.P.

[57] ABSTRACT

In a method of treating a semi-conductor wafer a short-chain polymer is deposited on the wafer to planarise surface features on the wafer and a diffusion layer is deposited on the surface of the polymer layer to allow moisture to be released from the polymer at a controlled rate.

16 Claims, 2 Drawing Sheets

PECVD
300 Deg C

Provides mechanical stability
during densification step $SiH_4 + 2N_2O \longrightarrow SiO_2\downarrow + 2H_2 + 2N_2$

UNDERLAYER

PECVD
300 Deg C
Adhesion Enhancer
$SiH_4 + 2N_2O \rightarrow SiO_2\downarrow + 2H_2 + 2N_2$

PLANARISING LAYER

CVD
Approx. 0 Deg C
Planarises features
$SiH_4 + 3H_2O_2 \rightarrow Si(OH)_4\downarrow + 2H_2O + H_2$ Apply direct heat DIFFUSION MEMBRANE controls rate at which moisture escapes from planarising layer PECVD
300 Deg C Provides mechanical stability during densification step

METHOD OF TREATING A SEMI-CONDUCTOR WAFER

This application is a continuation-in-part of U.S. application Ser. No. 08/362,429, filed on Dec. 28, 1994, which was the National Stage of International Application No. PCT/GB93/01368, filed on Jun. 30, 1993 that is currently pending before the Patent and Trademark Office.

BACKGROUND OF THE INVENTION

This invention relates to a method for treating a semiconductor wafer and in particular, but not exclusively, to what is known as planarisation.

Our Copending International Application No. PCT/GB93/01368 (published as WO94/01885) describes two methods of depositing a short-chain polymer on a wafer to form a generally planar layer:

1. A method of treating a semi-conductor wafer comprising, depositing a liquid short-chain polymer having the general formula $Si_x (OH)_y$ or $Si_x H_y (OH)_z$ on the wafer to form a generally planar layer.
2. A method of treating a semi-conductor wafer, including positioning the wafer in a chamber, introducing into the chamber silicon-containing gas or vapour and a compound, containing peroxide bonding, in vapour form, reacting the silicon-containing gas or vapour with the compound to form a short-chain polymer on the wafer to form a generally planar layer.

For the purpose of the description that follows wherein, these two methods will be referred to as "a method of the type described".

With the method of the type described the polymer will be in liquid form, at least to the extent that it is capable of a degree of self-levelling and, as is noted in Application No. PCT/GB93/01368, the water in the layer has to be removed at least partially, by heating. In order to prevent cracking, once a quantity of the water had been removed, a relatively thick capping layer was deposited prior to heating with the intention of providing physical stability for the polymer layer. Whilst this is advantageous it has not proved entirely successful as careful control of the process is required.

SUMMARY OF THE INVENTION

One aspect the invention consists in a method of the type described, further comprising depositing a diffusion layer on the surface of the polymer layer to allow moisture to be released from the polymer at a controlled rate.

Preferably the diffusion layer acts as a permeable membrane. In a preferred embodiment the diffusion layer is deposited at between −20° and 60° C. and preferably at around 0° C. The diffusion layer can be deposited by Plasma Enhanced Chemical Vapour Deposition (PECVD) and may be of the order of 500 Å. Once the diffusion layer is deposited, the wafer may be subjected to a preliminary heating stage prior to having a capping layer deposited. A final bake may then take place between 400°–475° C.

As has been mentioned in the earlier Application No. PCT/GB93/01368 the polymer layer may be preceded by the deposition of an underlayer or seed layer.

The method can conveniently include two chambers, one being a 'cold' chamber for the deposition of the polymer layer and the diffusion layer and the other being a hot chamber for the deposition of the underlayer and the capping layer.

BRIEF DESCRIPTION OF THE DRAWINGS

The invention may be performed in various ways and a specific embodiment will now be described, by way of example, with reference to the accompanying drawings, in which:

FIG. 1 shows an underlayer 1, which functions as an adhesion enhancer, formed by PECVD at 300 Deg. C. FIG. 2 shows a planarising layer 2 formed by CVD at approximately 0 Deg. C. The resultant layer, exhibiting surface tension forces 3, provides planarising features. FIG. 3 shows formation of a diffusion membrane 4 of 500 Å which controls the rate at which moisture escapes from the planarising layer. FIG. 4 shows formation of the capping layer 5 by PECVD at 300 Deg. C. The capping layer 5 provides mechanical stability during a later densification step.

DETAILED DESCRIPTION OF THE PREFERRED EMBODIMENT

Figure 1:
FIG. 1 to 4 illustrates schematically the steps of a planarisation process with the exception of the deposition of the diffusion layer.
Figure 2:
Figure 3:
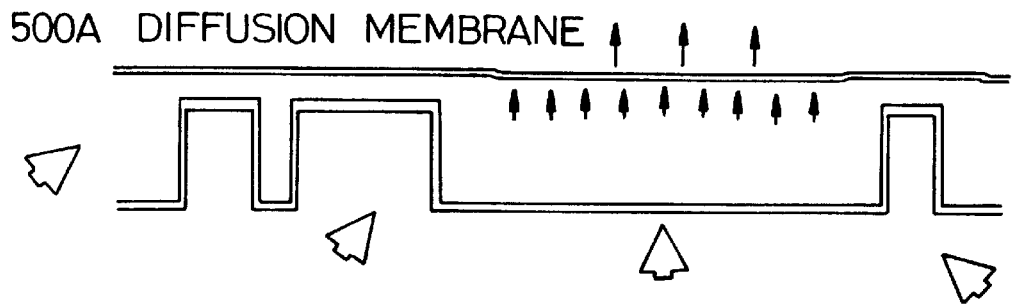

FIGS. 1 to 4 substantially correspond with FIGS. 3a to 3d of Application No. PCT/GB93/01368 with the exception that FIG. 3 replaces FIG. 3c of the earlier Application. Thus the explanation and variations described in the earlier Application in connection with FIGS. 1, 2 and 4 (3a, 3b and 3d) substantially stand and are hereby incorporated into this specification.

There is, however, an additional proposal that there should be two chambers in the apparatus. The first is a 'hot' chamber in which it is proposed that the steps illustrated in FIGS. 1 and 4 (of this Application) should be performed, whilst the second chamber is a 'cold' chamber in which the steps described in connection with FIGS. 1 and 2 (of this Application) are performed. The use of two chambers is not essential, but substantially increases the process control and repeatability.

Turning to FIG. 3 it has been discovered that the integrity of the polymer layer is very much dependent on the rate of loss of moisture being carefully controlled. Such control can be achieved by very careful temperature control, but this is awkward, expensive and time consuming.

Figure 4:
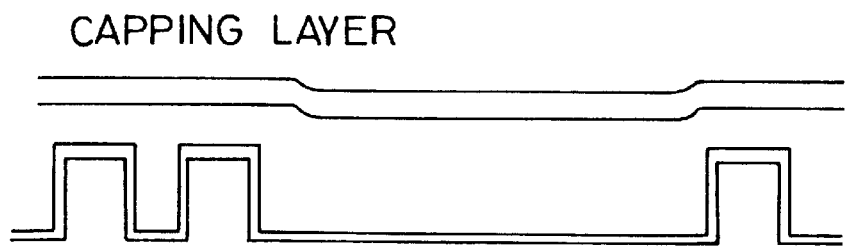
Figure 4:
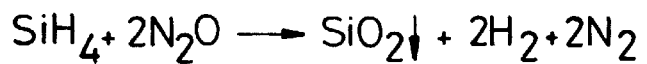

The Applicants have now appreciated that if they deposit under cold conditions (−20° to 60° C., but preferably at 0° C.) a very thin capping layer, e.g. of $SiO_2$, then the lattice structure of that layer is sufficiently open for it to act as a diffusion membrane, which controls the rate of moisture loss from the polymer or planarising layer when the wafer is heated, for example, by the heating up of the 'hot' chamber, to which the wafer can be transferred, prior to the FIG. 4 "hot" capping. Typically this heating may raise the wafer temperature to between 200°–450° C. (preferably 300° C.). Once that later cap is deposited a furnace or other final bake to 400° to 475° C. (preferably 450° C.) can take place.

The 'cold' cap or diffusion layer is preferably around 500 Å. The use of this 'cold' cap has produced high quality planarisation layers without cracks.

One further improvement which has been noted can be obtained by the use of $N_2O$, $O_2$ or $O_2$ containing gas plasma after the underlayer has been deposited. This can in affect be a continuation of the deposition process or a separate step. It appears to enhance the 'flowing' properties of the planarising layer.

This feature can be beneficially used in a method of the type described with or without the 'cold' cap.

We claim:

1. A method of treating a semiconductor wafer, comprising:

positioning the wafer in a chamber;
   introducing into the chamber a silicon containing gas or vapour and a compound, containing peroxide bonding, in vapour form;

reacting the silicon-containing gas or vapour with the compound to form a short-chain polymer on the wafer to form a generally planar polymer layer; and depositing a diffusion layer on the surface of the polymer layer to allow moisture to be released from the polymer at a controlled rate.

2. A method as claimed in claim 1, wherein the diffusion layer is deposited at between −20° and 60° C.

3. A method as claimed in claim 2, wherein the diffusion layer is deposited at around 0° C.

4. A method as claimed in claim 1, wherein the diffusion layer is deposited by Plasma Enhanced Chemical Vapour Deposition.

5. A method as claimed in claim 1, wherein the diffusion layer is of the order of 500 Å thick.

6. A method as claimed in claim 1, further including a preliminary heating stage.

7. A method as claimed in claim 6, wherein the diffusion layer is subsequently capped with a capping layer and the wafer is then baked.

8. A method as claimed in claim 1, wherein the deposition of the polymer layer is preceded by the deposition of an underlayer or seed layer.

9. A method as claimed in claim 1, further comprising treating the wafer with an $N_2O$, $O_2$ or an $O_2$ containing gas plasma after the underlayer or seed layer has been deposited.

10. A method of treating a semiconductor wafer, comprising:

positioning the wafer in a first chamber; introducing into the first chamber a silicon containing gas or vapour and a compound, containing peroxide bonding, in vapour form; reacting within the first chamber the silicon-containing gas or vapour with the compound to form a short-chain polymer on the wafer to form a generally planar polymer layer; and depositing within the first chamber a diffusion layer on the surface of the polymer layer to allow moisture to be released from the polymer at a controlled rate;

positioning the wafer in a second chamber; depositing within the second chamber a capping layer on the diffusion layer; and baking the wafer within the second chamber.

11. A method as claimed in claim 10, further comprising, prior to positioning the wafer in the first chamber and forming the polymer and diffusion layers, depositing an underlayer or seed layer on the wafer.

12. A method as claimed in claim 11, wherein the underlayer or seed layer is deposited in the second chamber.

13. A method as claimed in claim 10, wherein the first chamber is a cold chamber and the second chamber is a hot chamber.

14. A method as claimed in claim 11, wherein the first chamber is a cold chamber and the second chamber is a hot chamber.

15. A method as claimed in claim 12, wherein the first chamber is a cold chamber and the second chamber is a hot chamber.

16. A method of treating a semiconductor wafer, comprising:

positioning the wafer in a chamber;

introducing into the chamber a silicon containing gas or vapour and a compound, containing peroxide bonding, in vapour form;

reacting the silicon-containing gas or vapour with the compound to form a short-chain polymer on the wafer to form a generally planar polymer layer; and depositing a diffusion layer on the surface of the polymer layer to allow moisture to be released from the polymer at a controlled rate, wherein the diffusion layer acts as a permeable membrane.

* * * * *